US006172934B1

United States Patent
Uchihira

(10) Patent No.: US 6,172,934 B1
(45) Date of Patent: Jan. 9, 2001

(54) SEMICONDUCTOR MEMORY DEVICE PREVENTING A MALFUNCTION CAUSED BY A DEFECTIVE MAIN WORD LINE

(75) Inventor: Teruyuki Uchihira, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/438,945

(22) Filed: Nov. 12, 1999

(30) Foreign Application Priority Data

Nov. 12, 1998 (JP) .................................................. 10-322313

(51) Int. Cl.[7] .................................................. G11C 8/00
(52) U.S. Cl. .............................. 365/230.06; 365/225.7; 365/185.23
(58) Field of Search ........................... 365/230.06, 225.7, 365/185.09, 185.23

(56) References Cited

U.S. PATENT DOCUMENTS 5,436,910 * 7/1995 Takeshima et al. ................. 371/21.1
5,748,554 * 5/1998 Barth et al. ...................... 365/230.03
5,848,021 * 12/1998 Subibayashi ..................... 365/230.06
5,933,387 * 8/1999 Worley ............................ 365/230.03

* cited by examiner

Primary Examiner—Richard Elms
Assistant Examiner—Tuan T. Nguyen
(74) Attorney, Agent, or Firm—Young & Thompson

(57) ABSTRACT

A semiconductor memory device which prevents a sub word line from being incorrectly selected when a main word line breaks. A plurality of memory cells are connected to a main word decoder each via the main word line, a sub word decoder, and a sub word line. A plurality of redundant memory cells are connected to a redundant fuse circuit each via a redundant main word line, a redundant sub word decoder, and a redundant sub word line. A connection between the main word line and the sub word decoder and a connection between the redundant main word line and the redundant sub word decoder are each grounded by a high-resistance resistor.

8 Claims, 2 Drawing Sheets

SEMICONDUCTOR MEMORY DEVICE PREVENTING A MALFUNCTION CAUSED BY A DEFECTIVE MAIN WORD LINE

BACKGROUND OF THE INVENTION

1. Field of the Invention

The present invention relates to a semiconductor memory device, and more particularly to a semiconductor memory device that has a plurality of main word lines and a plurality of sub word lines to which memory cells are connected and that allows memory cells to be hierarchically selected by these main word lines and sub word lines.

2. Description of the Related Art

Conventionally, a semiconductor memory device of this type usually has a configuration shown in FIG. 2. Referring to FIG. 2, a plurality of main word lines 2 run from one end of a memory array to the other end. A plurality of sub word lines 4 are connected to each main word line 2 via sub word decoders 3 which act as selection means 3. Normally, to select one memory cell 6 from the memory array, an address signal 7 is sent to the memory device. Upon receiving this signal, a main word decoder 1 activates one of main word lines 2. In addition, the signal is sent to the memory device via a sub word line selection signal line 8 to select a sub word line 4. Upon receiving this signal, each sub word decoder 3, which is selection means connected to the main word line 2, selects one of the plurality of sub word lines 4. When the main word line 2 is broken at 18 as shown in FIG. 2, a fuse 14 at the connection between the main word decoder 1 and the main word line 2, as well as the fuse in a redundant fuse circuit 9, is opened during the trimming process which is performed after the wafer check process so that a redundant word line 10 may be used. This allows the redundant fuse circuit 9 to select the redundant word line 10 when the main word decoder 1 selects the main word line 2 which is broken.

A plurality of redundant sub word decoders 11 are connected to the redundant word line 10 and, via a redundant sub word line 13, a memory cell 12 is selected from the memory array. Therefore, the device may be used as a non-defective device.

When the main word line 2 is broken in the conventional semiconductor memory device described above, a part 19 of the main word line 2 shown in FIG. 2 becomes a floating contact. The main word line 2 which is broken during operation is broken by the fuse, and a relatively less powerful pull-up transistor 17 keeps the main word line 2 at the low level up to the position where the line is broken. However, beyond the position where the line is broken, there is no means for keeping the electric potential. Therefore, the electric potential of this part of the line, which is coupled with the near wire lines, increases, causing the sub word lines which should not be activated to activate.

SUMMARY OF THE INVENTION

In view of the foregoing, it is an object of the present invention to provide a semiconductor memory device in which sub word lines, which should not be activated when a main word line becomes defective, are not activated.

The semiconductor memory device according to the present invention has a plurality of main word lines and a plurality of sub word lines to which memory cells are connected, one of the plurality of sub word lines being selected for each block on each main word line via selection means, wherein the main word lines are each grounded by a high-resistance resistor.

In addition, multiple points on the main word line may be grounded. The connection between the main word line and the sub word line may be grounded. Also, the main word line may include a redundant main word line, and the sub word line may include a redundant sub word line. In addition, the main word line may be made of aluminum or tungsten.

BRIEF DESCRIPTION OF THE DRAWINGS

Other features and advantages of the invention will be made more apparent by the detailed description hereunder, taken in conjunction with the accompanying drawings, wherein.

DESCRIPTION OF THE PREFERRED EMBODIMENTS

An embodiment of the present invention will be described in detail by referring to the attached drawings.

Figure 1:
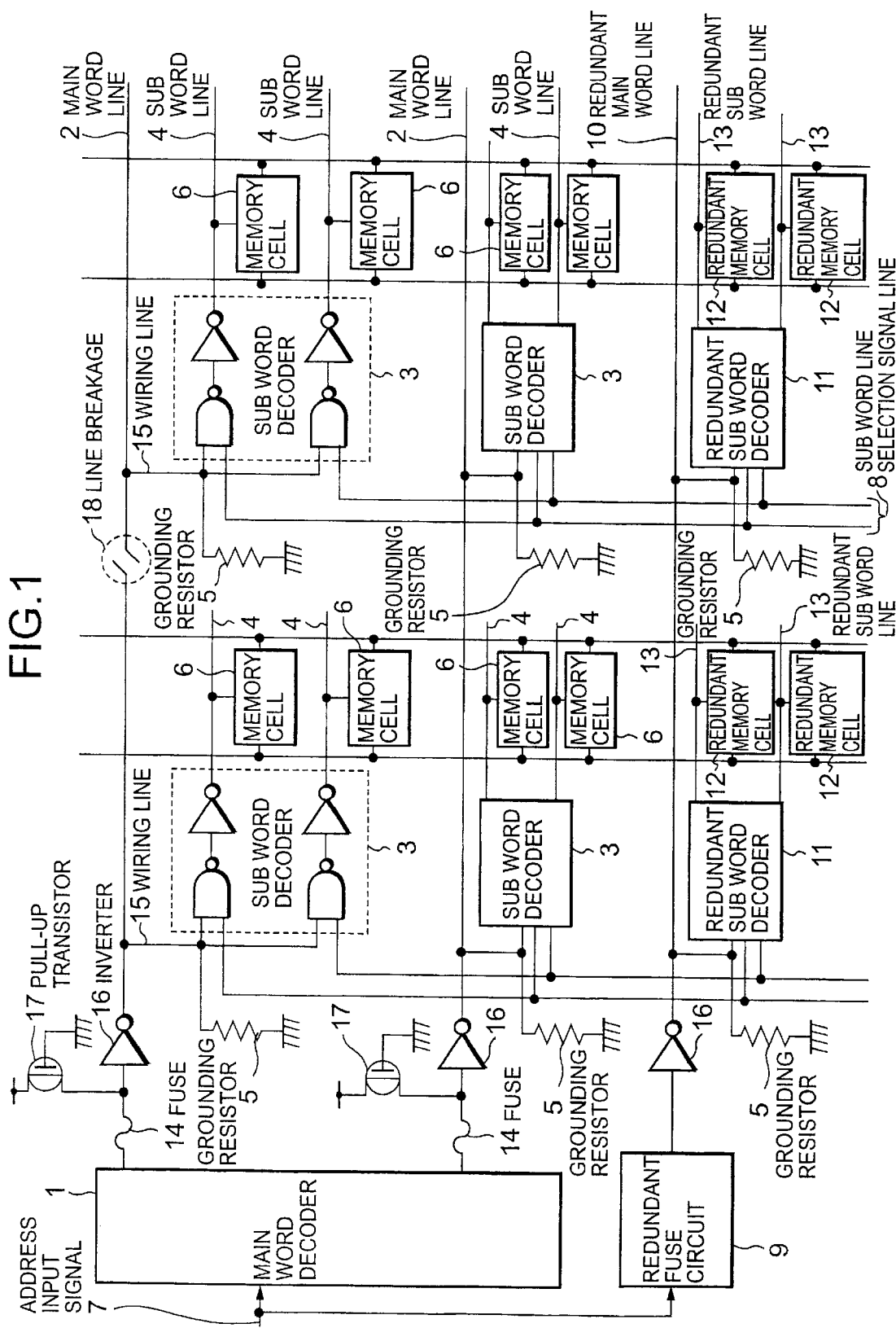
FIG. 1 is a block diagram showing an embodiment of a semiconductor memory device according to the present invention.
Figure 2:
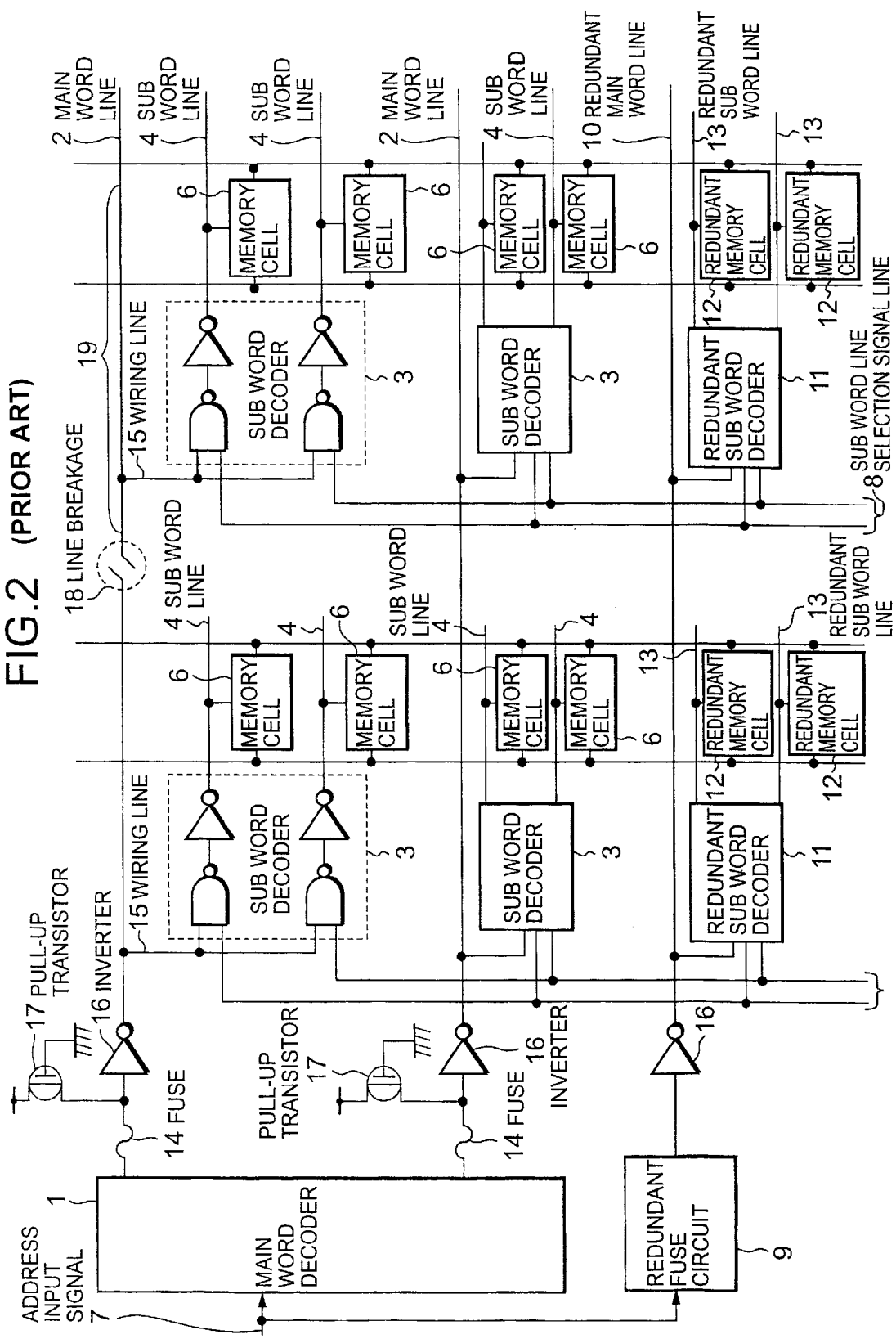
FIG. 2 is a block diagram showing a conventional semiconductor memory device.

FIG. 1 is a block diagram showing an embodiment of a semiconductor memory device according to the present invention.

As shown in FIG. 1, the semiconductor memory device used in the embodiment comprises a main word decoder 1, main word lines 2, sub word decoders 3, sub word lines 4, grounding resistors 5, memory cells 6, a redundant fuse circuit 9, a redundant main word line 10, redundant sub word decoders 11, redundant memory cells 12, redundant sub word lines 13, fuses 14, wiring lines 15, inverters 16, and pull-up transistors 17. The memory cells 6 and the redundant memory cells 12 constitute a cell array. The main word decoder 1, to which two main word lines 2, connected to the cell array, are connected via the fuses 14 and the inverters 16, decodes a signal sent as the address signal 7, selects one of two main word lines 2, sets the selected main word line high. The main word line 2 is made of aluminum or tungsten. In response to the signal from the main word line 2 and the signal from the sub word selection signal line 8, the sub word decoder 3 selects one of the plurality of sub word lines 4, each of which comes from the corresponding sub word decoder 3 and connects to the memory cells 6, and sets the selected sub word line 4 high. The grounding resistor 5 is connected anywhere from the point where the wiring line 15 connected to the sub word line 4 is branched from the main word line 2 to the entry point of the sub word decoder 3. The address signal 7 is sent also to the redundant fuse circuit 9, and the output from the redundant fuse circuit 9 is sent to the redundant main word line 10. When the redundant main word line 10 is used, the redundant sub word decoders 11 receives the signal from the redundant main word line 10 and the signal from the sub word selection signal line 8, selects one of the plurality of redundant sub word lines 13, each of which comes from the corresponding redundant sub word decoder 11 and connects to the memory cell 12, and sets the selected redundant sub word line high. The fuse 14 connected to the main word line 2 not used at that time is opened. The memory cell 6 is connected to the sub word line 4, and the redundant memory cell 12 is connected to the redundant sub word line 13.

Next, the operation of the embodiment will be described. In response to the address signal 7, the main word decoder 1 decodes the address signal 7 and selects one of main word lines 2 connected to the memory cell array. The selected main word line 2 goes high, and the signal enters the sub word decoders 3 via the wiring lines 15 branched from multiple points on the main word line 2. The sub word decoder 3 receives signals from the plurality of sub word selection signal lines 8. To select the memory cell 6, one of signals from the sub word selection signal lines 8 goes high. The sub word decoder 3 decodes the signal received from the main word line 2 and the signal received from the sub word selection signal line 8 to select one of the connected sub word lines 4.

When the main word line 2 is broken at 18 on the main word line 2, the following operation will be performed. First, the fact that the main word line 2 is defective is detected during the wafer check process, and the fuse 14 provided at the connection point between the corresponding main word line 2 and the main word decoder 1 is opened during the trimming process that is performed after the wafer check process. At the same time, the fuse in the redundant fuse circuit 9 is opened. The fuse that is opened corresponds to the address of the main word line 2 that is broken. During operation, in response to the address corresponding to the main word line 2 which is broken, the redundant fuse circuit 9 selects the redundant main word line 10 and sets the selected line high. The redundant sub word decoder 11, which receives signals from the redundant main word line 10 and the sub word selection signal line 8, selects one of redundant sub word lines 13.

At this time, the main word decoder 1 also decodes the address signal 7 to select the main word line 2. However, because the fuse 14 of the corresponding main word line 2 is opened, the main word line 2 does not go high.

The part of the broken main word line 2 that is near the main word decoder 1 is kept low by the relatively less powerful pull-up transistor 17, while the part of the main word line 2 that is beyond the line-break position 18 is kept low by the grounding resistor 5. The resistance of the grounding resistor 5 should be high enough not to affect usual word line selection operation. Coupling does not raise the potential from the grounding potential to the high level as long as there is no short, meaning that a time constant relatively larger with respect to the operating frequency of the device may be used.

When a main word line in this semiconductor memory device is broken, a high-resistance resistor connected to the part of the line that is far from the main word decoder, which acts as a main word line driving circuit, keeps the main word line at the grounding potential. Therefore, even if the main word line that is broken is replaced by the redundant word line, the defective word line is kept at the grounding potential and is not selected incorrectly.

As described above, grounding a word line with a high-resistance resistor keeps the potential of the main word line low even if line breakage occurs on any part of the word line. This prevents a sub word line from being selected incorrectly because of a floating contact. The redundant word line therefore increases the probability that more semiconductor memory devices with defective main word lines will be usable.

What is claimed is:

1. A semiconductor memory device comprising:

a main word line;

a sub word line;

a sub word line selection signal line;

a sub word decoder connected to said main word line and said sub word selection signal lines to drive said sub word line;

a memory cell connected to said sub word line; and a first resistor having a first terminal connected directly to said main word line at an input of said sub word decoder and having a second terminal connected to a power source.

2. The semiconductor memory device according to claim 1 wherein said power source is at a grounding potential.

3. The semiconductor memory device according to claim 2, further comprising a driving circuit, said main word line being divided into a first and a second portion by a line breakage thereof, said first portion of said main word line being driven by said driving circuit, said second portion of said main word line being driven by said grounding potential via said first resistor.

4. The semiconductor memory device according to claim 2, further comprising a second resistor connected between said main word line and said power source.

5. The semiconductor memory device according to claim 4, further comprising a driving circuit, said main word line being divided into a first and a second portion by a line breakage thereof, said first portion of said main word line being driven by said driving circuit and said grounding potential via said second resistor, said second portion of said main word line being driven by said grounding potential via said first resistor without being driven by said driving circuit.

6. The semiconductor memory device according to claim 5, wherein a driving ability of said driving circuit is greater than a driving ability of said grounding potential via said first resistor.

7. A semiconductor device comprising:

a plurality of main word lines;

a plurality of sub word lines;

a plurality of sub word line selection signal lines;

a plurality of sub word decoders each connected to an associated one of said main word lines and to an associated one of said sub word line selection signal lines to drive an associated one of said sub word lines;

a plurality of memory cells each connected to an associated one of said sub word lines; and a plurality of resistors each provided in a one-to-one correspondence with an associated one of said sub word decoders and connected between an associated one of said main word lines and a power source.

8. A semiconductor memory device comprising:

a main word line;

a sub word line;

a sub word line selection signal line;

a sub word decoder connected to said main word line and said sub word selection signal line to drive said sub word line;

a memory cell connected to said sub word line;

a first resistor connected between said main word line and a ground potential; and a driving circuit, said main word line being divided into a first and a second portion by a line breakage thereof, said first portion of said main word line being driven by said driving circuit, said second portion of said main word line being driven by said ground potential via said first resistor.

* * * * *